(12) United States Patent
Patel et al.

(10) Patent No.: US 6,665,194 B1
(45) Date of Patent: Dec. 16, 2003

(54) CHIP PACKAGE HAVING CONNECTORS ON AT LEAST TWO SIDES

(75) Inventors: Janak G. Patel, South Burlington, VT (US); Dana J. Thygesen, Monkton, VT (US)

(73) Assignee: International Business Machines Corporation, Armonk, NY (US)

( * ) Notice: Subject to any disclaimer, the term of this patent is extended or adjusted under 35 U.S.C. 154(b) by 213 days.

(21) Appl. No.: 09/711,038

(22) Filed: Nov. 9, 2000

(51) Int. Cl.[7] .......................... H05K 7/00; H01L 25/00; H01L 21/44

(52) U.S. Cl. .................. 361/767; 361/748; 361/760; 257/777; 257/778; 438/106; 438/107; 438/108

(58) Field of Search .................. 257/686, 777, 257/723, 778; 333/246; 174/261; 438/108, 109, 455, 928; 29/840; 361/794

(56) References Cited

U.S. PATENT DOCUMENTS

| | | | | |
|---|---|---|---|---|
| 5,222,014 A | * | 6/1993 | Lin ............................. 361/414 |
| 5,614,766 A | | 3/1997 | Takasu et al. ............... 257/777 |
| 5,712,769 A | | 1/1998 | Ruque ......................... 361/796 |
| 5,801,072 A | * | 9/1998 | Barber ......................... 438/107 |
| 5,847,936 A | | 12/1998 | Forchand et al. ........... 361/794 |
| 5,973,930 A | | 10/1999 | Ikeda et al. ................. 361/768 |
| 5,994,166 A | | 11/1999 | Akram et al. ............... 438/108 |
| 6,150,724 A | * | 11/2000 | Wenzel ....................... 257/777 |
| 6,239,385 B1 | * | 5/2001 | Schwiebert ................. 174/261 |
| 6,294,407 B1 | * | 9/2001 | Jacobs ........................ 438/118 |

* cited by examiner

Primary Examiner—David Martin
Assistant Examiner—Michael L. Lindinger
(74) Attorney, Agent, or Firm—Anthony J. Canale

(57) ABSTRACT

A substrate for supporting a semiconductor chip has area array connectors on at least two surfaces to provide a large number of connectors to the chip. At least one contact on one surface is not connected to a contact on the other surface through the substrate. Carriers, such as printed circuit boards are mounted to the two surfaces.

10 Claims, 3 Drawing Sheets

CHIP PACKAGE HAVING CONNECTORS ON AT LEAST TWO SIDES

FIELD OF THE INVENTION

This invention generally relates to packaging of semiconductor modules. More particularly, it relates to a semiconductor package that has a large number of connections. Even more particularly, it relates to a semiconductor package able to accommodate a large number of connections with improved electrical characteristics.

BACKGROUND OF THE INVENTION

High pin count semiconductor packages, such as high density ball grid array or column grid array surface mount packages, require more complicated and expensive printed circuit (PC) boards to accommodate the large number of connections. In one alternative, each ball or pin connector on the semiconductor package can be shrunk and spaces between balls and pins can be reduced as well. However, to accommodate the larger number of connections more layers of metal must be provided in the PC board. In addition the smaller contacts increase series resistance and closer contacts increase capacitance, and the two effects combine to increase RC delay, degrading performance. Also there is a greater likelihood of bridging across closer contacts.

In a second alternative, higher pin count can be accomplished by providing larger semiconductor packages, with the wiring spread out in the package. But larger packages add to package cost, reduce performance from longer leads in the package, and use up more valuable real estate on the PC board. In addition, larger packages suffer more from thermal expansion mismatch, and therefore offer lower reliability. Thus, a better solution for high pin count semiconductor packages is needed that avoids larger packages, lower reliability, extra levels of metal in PC boards, degraded electrical performance, and closer contacts, and this solution is provided by the following invention.

SUMMARY OF THE INVENTION

It is therefore an object of the present invention to increase the number of connections to a package by providing an area array of connections on more than one surface of the package.

It is a further object of the present invention to provide a system comprising a pair of printed circuit boards connected to a single semiconductor package.

It is a feature of the present invention that the package has an area array of connectors on two or more surfaces.

It is a further feature of the present invention that the package has the area array of connections on top and bottom surfaces.

It is an advantage of the present invention that the number of connections to a package is substantially higher without decreasing the size of connectors or the space there between, and without increasing the size of the package, the length of leads, or RC delay.

It is an advantage of the present invention that the number of connections to a package is substantially higher without degrading electrical characteristics.

These and other objects, features, and advantages of the invention are accomplished by a substrate for electrical and mechanical connection to a semiconductor chip. The substrate includes a top surface and a bottom surface. A first area array of contacts is on the top surface and a second area array of contacts is on the bottom surface. The first array is for connecting the module to a first carrier and the second array is for connecting the module to a second carrier. At least one contact of the first array is not connected to a contact of the second array through the substrate.

Another aspect of the invention is accomplished by a semiconductor module, that includes a chip having a first chip contact and a second chip contact. A substrate is electrically and mechanically connected to the chip. The substrate has a first surface and a second surface different from the first surface. The substrate further comprises a first substrate contact on the first surface and a second substrate contact on the second surface. The first chip contact is electrically connected to the first substrate contact and the second chip contact is electrically connected to the second substrate contact. The first substrate contact does not connect with the second substrate contact through the substrate.

BRIEF DESCRIPTION OF THE DRAWINGS

The foregoing and other objects, features, and advantages of the invention will be apparent from the following detailed description of the invention, as illustrated in the accompanying drawings, in which.

DETAILED DESCRIPTION OF THE INVENTION

The present inventors recognized that shrinking connectors and the space between them would substantially increase the cost of printed circuit boards, degrade electrical performance by increasing RC delay, and degrade yield and reliability of connections. To provide for additional connections without any of these shortcomings, the inventors provided for area arrays of contacts on at least two surfaces of a package. The area arrays on two sides of a package provide more connections than any one area array connected to one surface of the package could.

Figure 1:
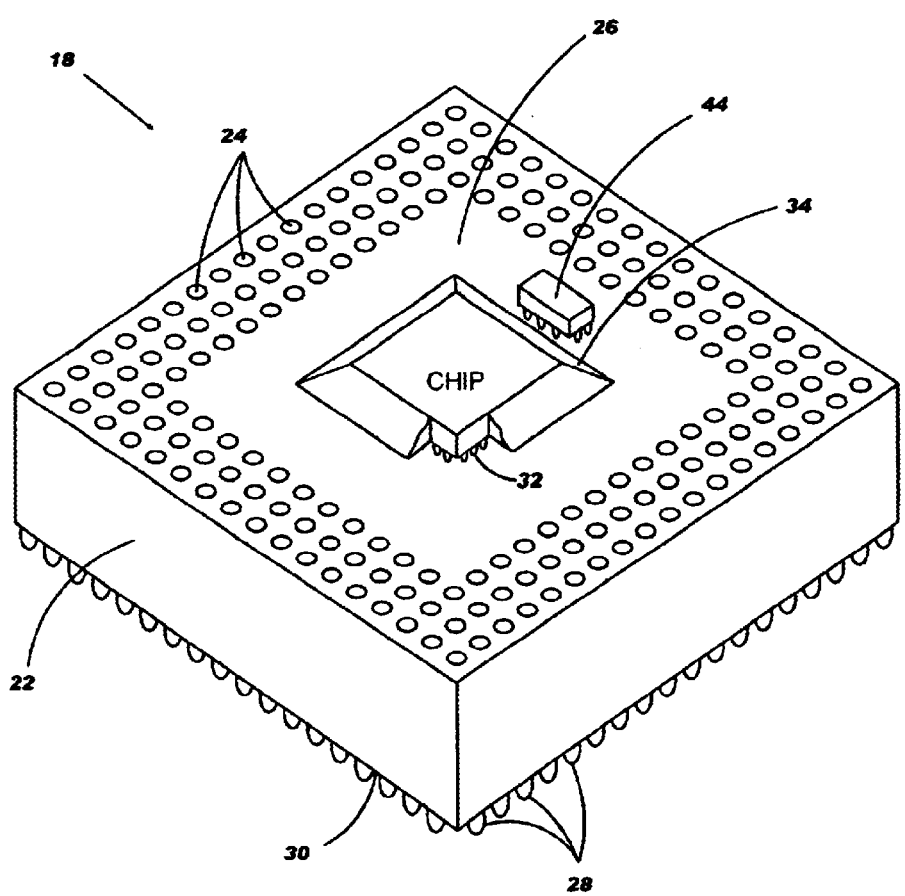
FIG. 1 is a three dimensional view of a semiconductor package of the present invention.
Figure 2:
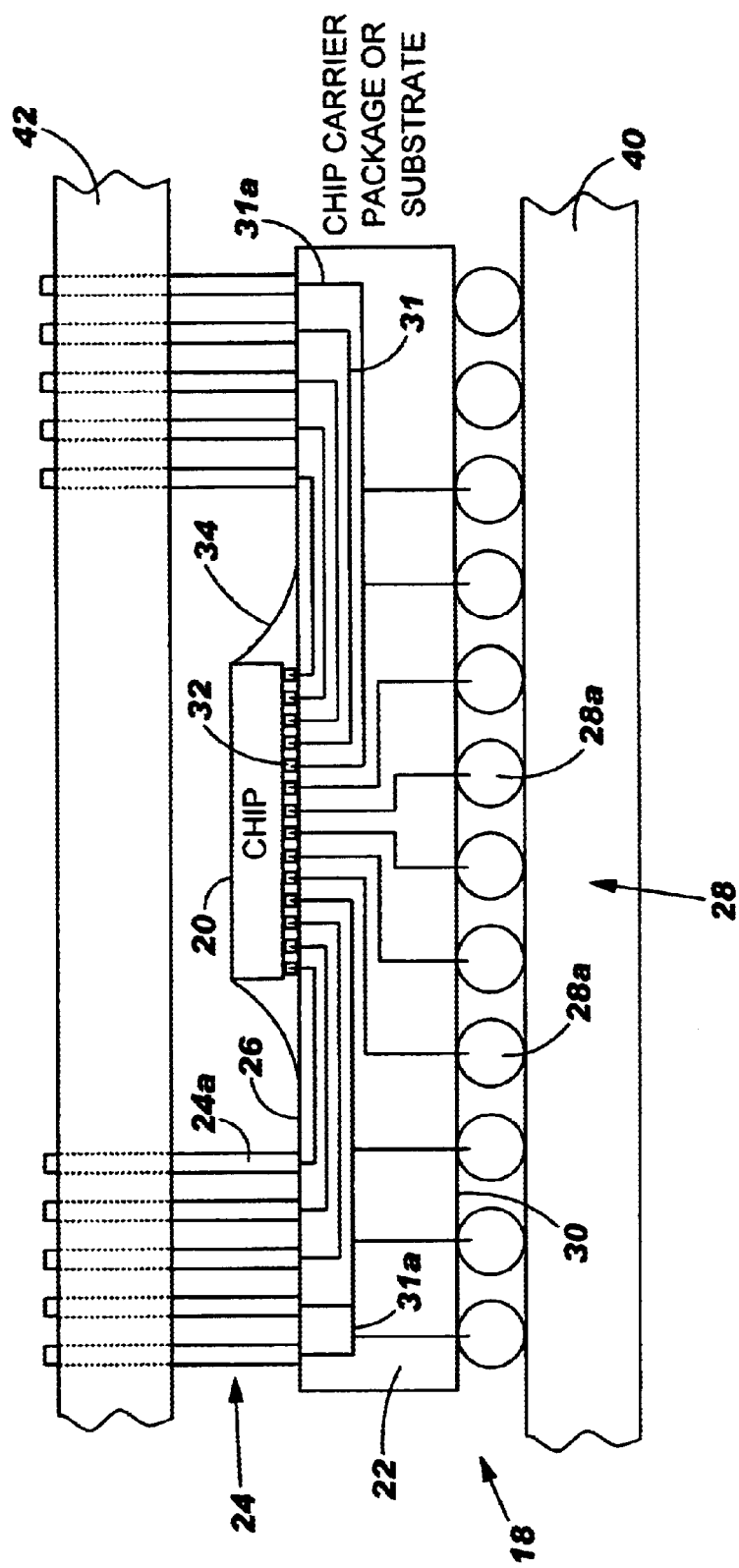
FIG. 2 is a cross sectional view of the package of FIG. 1 after mounting a PC board carrier to each area array of the package.

Semiconductor package 18 includes chip 20 mounted on substrate 22 which has area array connectors 24 on top surface 26, area array connectors 28 on bottom surface 30, and internal conducive wires 31, as shown in FIGS. 1 and 2. Chip 20 is preferably mounted to substrate 22 with solder bumps 32. Space between chip 20 and substrate 22 filled with under fill epoxy 34. Bottom area array 28 is for connection to primary carrier 40 while top array 24 is for connection to secondary carrier 42. Carriers 40, 42 are preferably printed circuit boards, and they may be fabricated of a material such as FR4, ceramic, glass ceramic, or flex.

Area array connectors 24, 28 have individual connectors 24a, 28a, organized in a two dimensional area array. Every site of the area array can be populated but not every site need be populated for the array to be considered an area array. For example, in FIG. 1, array 28 may have connectors populating every array position on bottom surface 30 of substrate 22 while room is left in array 24 on top surface 26 for chip 20 and for decoupling capacitor 44. Decoupling capacitor 44 can be provided on one or both sides of substrate 22. Connectors 24, 28 are for providing power, ground, and I/O.

Figure 3:
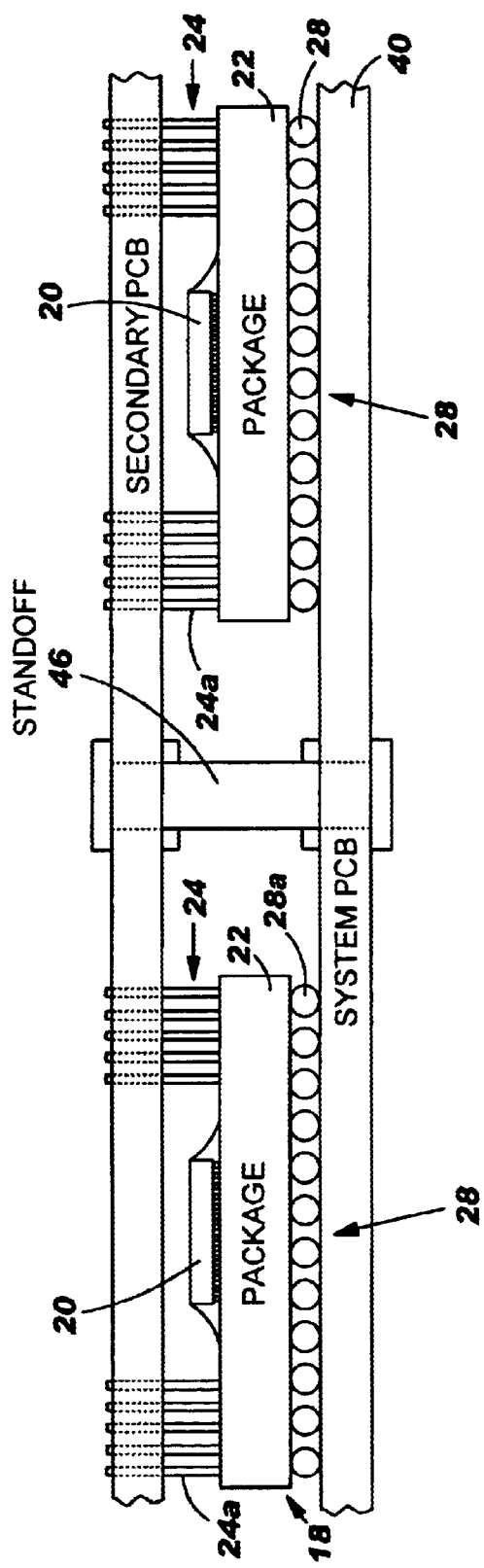
FIG. 3 is a cross sectional view of a plurality of packages mounted to two PC board carriers.

Chip 20 can also be electrically connected to substrate 22 with wire bonds, as is well known in the art. Substrate 22 is a multilayer substrate, such as a ceramic substrate, a glass ceramic substrate, FR4, flex, or a surface laminar circuit plastic substrate. Teflon material based substrates can also be used, such as IBM's hyper BGA. Area array connectors 24, 28 include ball grid arrays, pin grid arrays, or solder columns or pads for wire bonds or pin connection. In the embodiment shown in FIG. 2, top side array connectors 24 are formed of kovar pins to provide clearance for chip 20 while bottom side array 28 is a ball grid array. Substrate 22 can be a cavity substrate (not shown) to facilitate connection through ball grid arrays on both top and bottom surfaces. The present invention is adaptable to multiple semiconductor chip packages 22 being connected to the same pair of carriers 40, 42, as shown in FIG. 3. Standoff 46 may be used in this package for structural purposes.

To maximize the number of connectors available to chip 20, most connectors 24a on top surface 26 are not connected to connectors 28a on bottom surface 30 through internal conducive wires 31 in substrate 22 (FIG. 2). However, there may be duplication of connectors internal conducive wires 31a for power supplies, such as power and ground, and these may be tied together within substrate 22 and provided to both carriers 40, 42 to improve the signal environment.

Multiple chips can be provided on substrate 22, either on top surface 26 or on bottom surface 30. A memory chip that needs few or no external I/O connectors can be connected in association with a processor chip on substrate 22 to provide improved performance to the processor while still providing room around it for many additional connectors 24a, 28a for connection to the processor chip. Similarly, decoupling capacitors can be provided on top surface 26 and bottom surface 30 of substrate 22 and on both carriers 40 and 42.

In addition to providing more interconnects the invention provides advantage from shielding from two sides by providing solid ground planes on both carriers and a picket fence of interconnects around the perimeter of the substrate.

While several embodiments of the invention, together with modifications thereof, have been described in detail herein and illustrated in the accompanying drawings, it will be evident that various further modifications are possible without departing from the scope of the invention. Nothing in the above specification is intended to limit the invention more narrowly than the appended claims. The examples given are intended only to be illustrative rather than exclusive.

What is claimed is:

1. An electronic structure, comprising:
   a chip having a first chip contact and a second chip contact;
   a substrate electrically and mechanically connected to said chip, said substrate comprising a first surface for mounting said chip, a second surface different from said first surface, a first electrical conductor extending only from a first location on said first surface to a second location on said first surface through said substrate, and a second electrical conductor extending from said first surface to said second surface through said substrate, said substrate further comprising a first substrate contact at the second location on said first surface and a second substrate contact on said second surface, wherein said first chip contact at the first location is electrically connected to said first substrate contact at the second location by said first electrical conductor and said second chip contact is electrically connected to said second substrate contact by said second electrical conductor, and further wherein said first electrical conductor is electrically isolated from said second electrical conductor; and
   a first printed circuit board connected to said first substrate contact and a second printed circuit board connected to said second substrate contact.

2. The electronic structure as recited in claim 1, wherein said first printed circuit board and said second printed circuit board provide electrical shielding on two sides of said semiconductor chip.

3. The electronic structure as recited in claim 1, wherein said first and second printed circuit boards comprise ceramic, glass ceramic, or flex.

4. The electronic structure as recited in claim 1, wherein said first substrate contact is one of an array of contacts.

5. The electronic structure as recited in claim 4, wherein said array of contacts is a ball grid array, a column grid array, pins or pads.

6. The electronic structure as recited in claim 1, wherein said first and second electrical conductors comprise internal conducive wires.

7. The electronic structure as recited in claim 1, wherein said first printed circuit board and said second printed circuit board provide electrical signals to said chip.

8. A method of fabricating an electronic assembly comprising the steps of:
   a. mounting a semiconductor chip to a substrate, said chip having a first chip contact and a second chip contact, said substrate comprising a first surface, a second surface different from said fist surface, a first electrical conductor extending only from a first location on said first surface to a second location on said first surface through said substrate, and a second electrical conductor extending from said first surface to said second surface through said substrate, said substrate further comprising a first substrate contact at the second location on said first surface electrically connected to said first electrical conductor and a second substrate contact on said second surface electrically connected to said second electrical conductor, wherein said first electrical conductor is electrically isolated from said second electrical conductor;
   b. connecting said first chip contact at the first location to said first electrical conductor and connecting said second chip contact to said second electrical conductor; and
   c. connecting a first printed circuit board to said first substrate contact and a second printed circuit board to said second substrate contact.

9. The method as recited in claim 8, further comprising the step of mounting a plurality of semiconductor chips on said substrate.

10. The method as recited in claim 9, wherein a first chip is mounted on said first surface and a second chip is mounted on said second surface.

* * * * *